United States Patent
Sandhu et al.

(10) Patent No.: US 6,614,072 B2
(45) Date of Patent: Sep. 2, 2003

(54) HIGH COUPLING SPLIT-GATE TRANSISTOR

(75) Inventors: Sukesh Sandhu, Boise, ID (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/976,000

(22) Filed: Oct. 15, 2001

(65) Prior Publication Data

US 2002/0072174 A1 Jun. 13, 2002

Related U.S. Application Data

(63) Continuation of application No. 09/285,667, filed on Apr. 5, 1999, now Pat. No. 6,323,085.

(51) Int. Cl.[7] ..................... H01L 27/788; H01L 21/336
(52) U.S. Cl. ..................... 257/317; 257/316; 438/264
(58) Field of Search ........................... 257/317, 315, 257/316; 438/264

(56) References Cited

U.S. PATENT DOCUMENTS

| | | |
|---|---|---|
| 4,698,900 A | 10/1987 | Esquivel |
| 4,812,885 A | 3/1989 | Riemenschneider |
| 5,492,846 A | 2/1996 | Hara |
| 5,646,059 A | 7/1997 | Sheu et al. |
| 5,675,162 A | 10/1997 | Hong |
| 5,770,501 A | 6/1998 | Hong |
| 6,153,472 A | * 11/2000 | Ding et al. ............... 438/264 |

* cited by examiner

Primary Examiner—Amir Zarabian
Assistant Examiner—Kiesha Rose
(74) Attorney, Agent, or Firm—Dickstein Shapiro Morin & Oshinsky LLP

(57) ABSTRACT

A split-gate transistor having high coupling for use in flash memory, EPROMs, and EEPROMs. The transistor has a U-shaped floating gate and a U-shaped control gate, thereby significantly increasing the surface area of the gates and increasing the voltage coupling ratio. The high coupling permits the operation voltage to be reduced while increasing operation speed, and the configuration of the transistor gates allows their use in high density arrays without sacrificing speed or degrading operations. A process for forming such transistors is also disclosed, wherein a polysilicon layer is deposited and then etched so that nitride and polysilicon spacers may be formed in between portions of polysilicon which are then etched to form floating gates. The nitride portion of the spacers is removed, and then the dielectric and control gate layers are formed on the floating gates to yield an array of split-gate transistors.

8 Claims, 6 Drawing Sheets

HIGH COUPLING SPLIT-GATE TRANSISTOR

This application is a continuation of application Ser. No. 09/285,667, filed Apr. 5, 1999, now U.S. Pat. No. 6,323,085 the entire content of which is incorporated herein by reference.

FIELD OF THE INVENTION

The present invention relates generally to an improved semiconductor structure for high density device arrays, and in particular to an improved split-gate transistor having high coupling, and to a process for its formation.

BACKGROUND OF THE INVENTION

Nonvolatile semiconductor memory devices based on metal-oxide-semiconductor field effect transistors (MOSFETs) are well-known in the art. There are currently three general types of MOSFET nonvolatile memory devices in use: EPROMs, EEPROMs, and flash EEPROMs. A flash EEPROM is comprised of an array of non-volatile storage cells from which data may be read any number of times without disturbing the state of the stored data. Each cell is an individual FET that stores a bit of information as the presence or absence of an electrical charge on a floating gate.

Typically EEPROMs are comprised of an array of paired transistors: a select or access transistor and a storage transistor. Many flash EEPROMs combine these two transistors into one device—a split-gate transistor with two gates sharing a single device channel. The control gate serves the function of the select or access transistor, and the floating gate serves as a storage device. The split-gate configuration alleviates the over-erase problem caused by Fowler-Nordheim tunneling, but results in a larger cell size.

Data is typically written to a cell by hot electron injection which occurs when a high positive voltage is applied to both the control gate and the drain line. Some of the electrons in the device channel will acquire sufficient energy to jump the energy barrier at the interface of the device channel and the tunneling oxide. Once they are in the tunneling oxide, the electrons are pulled toward the floating gate by the positive voltage on the control gate. This results in charge collection on the floating gate, which in turn affects the threshold voltage of the control gate.

Alternatively, data may be written to a cell by Fowler-Nordheim tunneling, also called "cold electron" tunneling. Cold electron tunneling is a quantum-mechanical effect allowing electrons to pass through, instead of over, the energy barrier at the interface of the device channel and the tunneling oxide. Because the electrons are passing through the barrier, this process requires less energy than hot electron injection, and can occur at a lower current density. In addition, use of Fowler-Nordheim tunneling for both programming and erasing enables operation voltages and power consumption to be reduced.

The cells are read by addressing the control gate and drain line of a cell with a positive voltage (e.g., 3 to 5 volts). If the floating gate is negatively charged (logical state "1"), the threshold voltage will be high and the cell device will not turn on when addressed. If the floating gate is uncharged (logical state "0"), the threshold voltage will be low, and the device channel will invert when addressed, causing a resulting current in the drain line that can be sensed by current sensing methods known in the art.

Erasure is accomplished by Fowler-Nordheim tunneling. A high voltage (e.g. 10 volts) is applied between the control gate and the source, causing electrons to leave the floating gate and tunnel through the tunneling oxide to the drain. Any individual cell or all cells may be simultaneously erased by applying an electrical pulse to any or all cells.

The easy reprogrammability, inherent short access time and non-volatility of the stored data make flash memory very attractive for many computer applications. Advancements in semiconductor fabrication technology have enabled the formation of denser and smaller memory arrays by decreasing the size of individual devices. Decreased device size has a cost, however, that is especially noticeable for split-gate transistors. Reduction in the size of the floating gate reduces the coupling ratio, resulting in slower operation speeds and degradation of programming and erase operations. In addition, devices with low coupling ratios require higher voltages for operation, an undesirable characteristic for many applications such as portable systems.

There is needed, therefore, a split-gate transistor exhibiting high coupling for use in device arrays such as flash memory arrays. A simple method of fabricating a high coupling split-gate transistor is also needed.

SUMMARY OF THE INVENTION

The present invention provides a split-gate transistor having high coupling due to the U-shaped configuration of the floating and control gates. Also provided is a method for its formation, in which a first polysilicon layer is formed on a substrate and then a plurality of nitride spacers are formed to divide the first polysilicon layer into individual floating gates. A plurality of polysilicon spacers are formed on top of the nitride spacers, which are then removed. Dielectric and control gate layers are then deposited. The resultant U-shaped configuration of the gates allows for a high coupling, thereby increasing the speed of the device while lowering the operation voltage and increasing the device density.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide. The following detailed description is, therefore, not to be taken in a limiting sense, and the scope of the present invention is defined by the appended claims.

Figure 1:
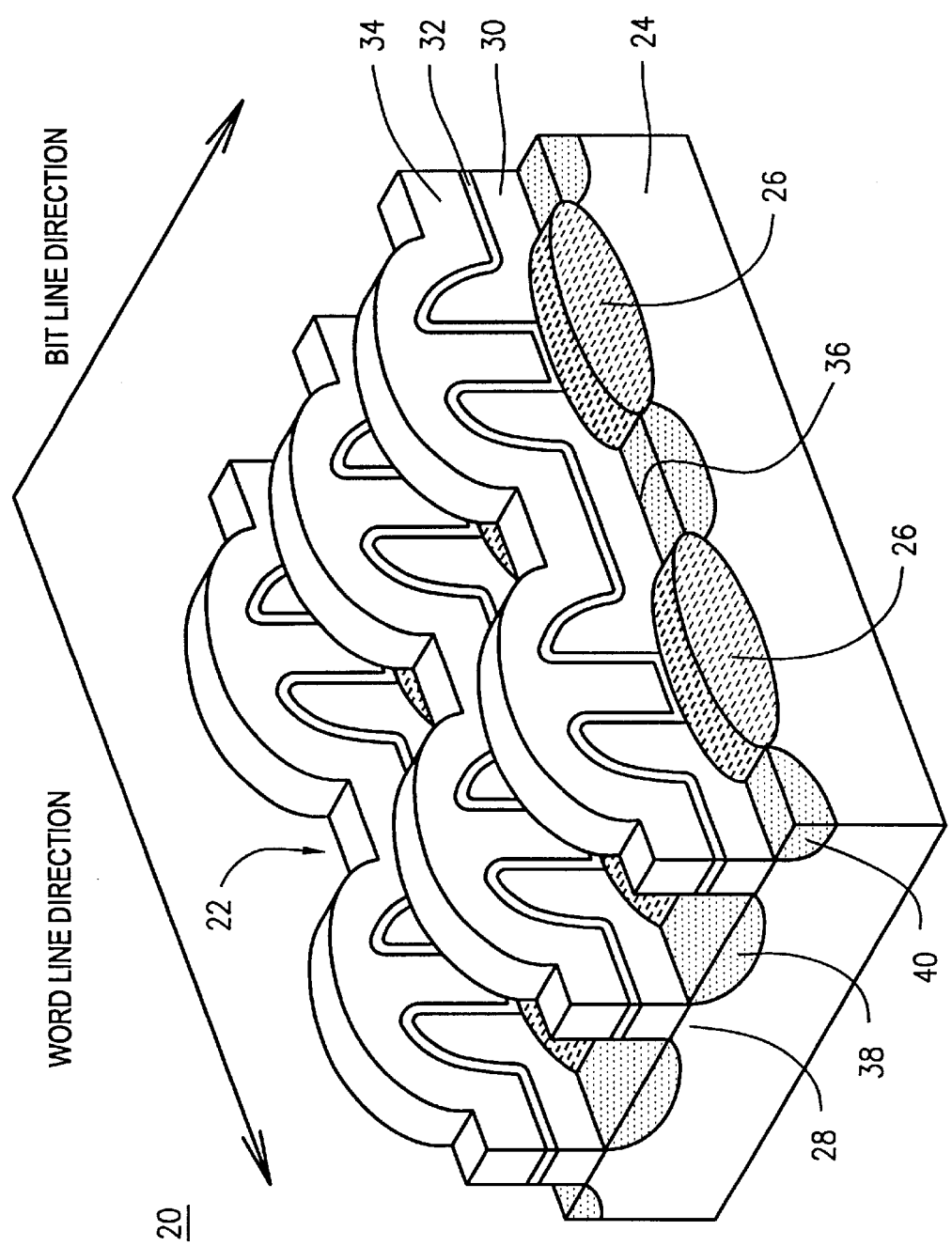
FIG. 1 is a perspective view of the split-gate transistor of the present invention.
Figure 2:
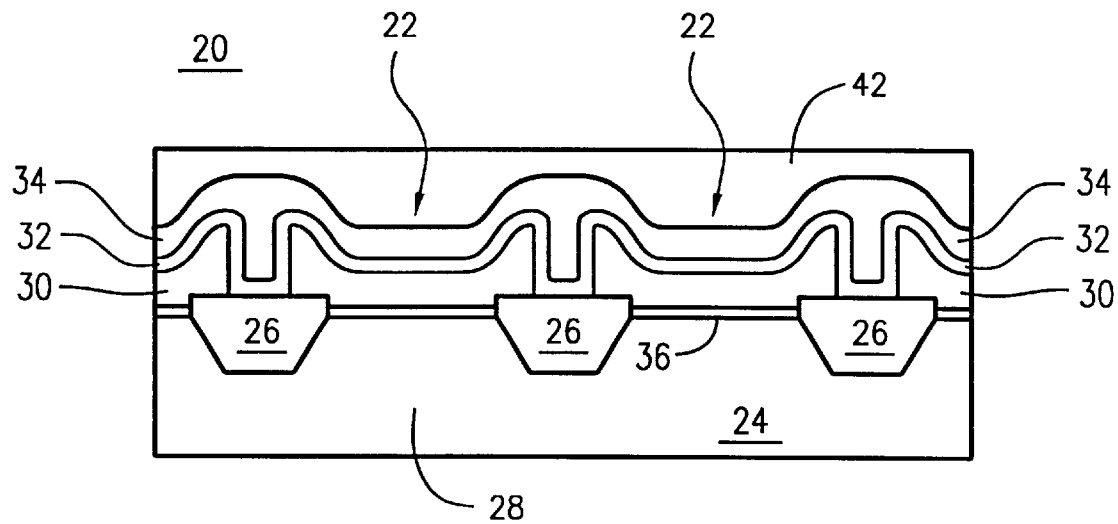
FIG. 2 is a cross-sectional view of the transistor of FIG. 1.

Referring now to the drawings, where like elements are designated by like reference numerals, an embodiment of the device array 20 of the present invention is shown in FIGS. 1 and 2. The device array 20 is comprised of a plurality of split-gate transistors 22 formed on a substrate 24, where the split-gate transistors 22 are separated from each other by isolation bars 26. Each split-gate transistor 22 comprises two gates, a floating gate 30 and a control gate 34, which are self-aligned with the device channel 28. The floating gate 30 and control gate 34 may be formed of polysilicon, tungsten silicide, or other suitable conductive material, and have a thickness within the range of 200 to 1500 Angstroms, preferably about 500 Angstroms.

The device channel 28 is overlain by a tunneling oxide layer 36 comprised of thermal oxide, and having a thickness of approximately 50 to 110 Angstroms thick. Preferably the tunneling oxide 36 is about 80 Angstroms thick. On top of the tunneling oxide 36 is the floating gate 30. A dielectric layer 32 is formed on top of the floating gate 30, and serves to insulate the floating gate 30 from the control gate 34. The dielectric layer 32 is approximately 70 to 180 Angstroms thick, and is preferably about 120 to 140 Angstroms thick, and may be formed of a suitable dielectric material or materials, such as ONO (oxide-nitride-oxide), ON (oxide-nitride) or oxide. The control gate 34 lies on top of the dielectric layer 32, forming the top layer of the split-gate transistor 22. Each split-gate transistor 22 also has doped source and drain regions 38, 40. As shown in FIG. 2, an insulating layer 42 of silicon dioxide, BSG, PSG, BPSG, or the like may cover the entire surface of the array 20.

Data is written to a split-gate transistor 22 by hot electron injection or Fowler-Nordheim tunneling, which occur when a high positive voltage is applied to both the control gate 34 and the drain 40. The transistors 22 are read by addressing the control gate 34 with a positive voltage (e.g., 3 to 5 volts). Erasure is accomplished by Fowler-Nordheim tunneling, which occurs when a high voltage (e.g. 10 volts) is applied between the control gate 34 and the source 38, causing electrons to leave the floating gate 30 and tunnel through the tunneling oxide 36 to the source 38.

The split-gate transistor 22 of the present invention has a high coupling ratio due to its U-shaped gates. Compared to a conventional flat floating gate, the floating gate 30, dielectric layer 32, and the control gate 34 have increased surface areas due to their generally U-shaped configuration. This increased surface area increases the capacitance of each layer, resulting in high coupling, as shown in the following equation, where $C_D$ represents the capacitance of the dielectric layer 32, and $C_{tun}$ represents the capacitance of the tunneling oxide layer 36: coupling=$C_D/(C_D+C_{tun})$. Because of its high coupling, the split-gate transistor 22 has increased programming and erase speeds, and a reduced operation voltage. In addition, the U-shaped configuration of the floating gate 30 expands the surface area by increasing the size of the floating gate in the vertical direction, thereby preserving a relatively small gate (in the horizontal direction) and maintaining or increasing array density.

The device array 20 is manufactured through a process described as following, and illustrated by FIGS. 3 through 12. First, a substrate 24, which may be any of the types of substrate described above, is selected as the base for the device array 20. The substrate 24 may be doped or undoped, but a p-type doped wafer is preferred. If PMOS devices are to be formed, photolithography is used to define areas where n-wells (not shown) are implanted. The level of doping in the n-wells may vary but should be of comparable or greater strength than the doping level of the substrate 24.

Figure 3:
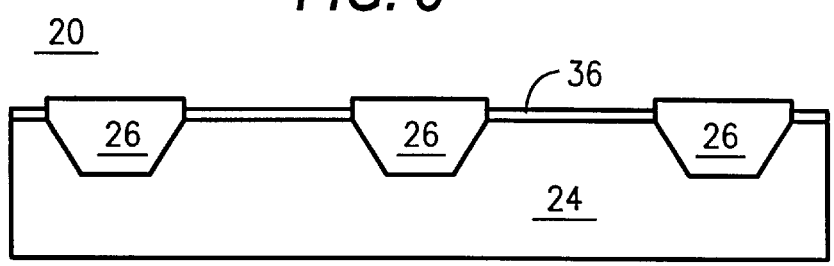
FIG. 3 is a cross-sectional view of a semiconductor wafer undergoing the process of a preferred embodiment.

As shown in FIG. 3, isolation bars 26 are formed prior to the formation of the split-cell transistors. These bars 26 may be formed by any known technique such as thermal oxidation of the underlying substrate 24 in a LOCOS process or by etching trenches and filling them with oxide in an STI process. Source and drain regions 38,40 are also formed at this time. The first step in the process of forming the transistors 22 is the growth of a tunneling oxide layer 36, which is approximately 50 to 110 Angstroms thick, on top of the substrate 24 by means such as thermal oxidation or chemical vapor deposition (CVD). Preferably the tunneling oxide layer 36 is approximately 70 to 100 Angstroms thick, and most preferable is approximately 80 Angstroms thick.

Figure 4:
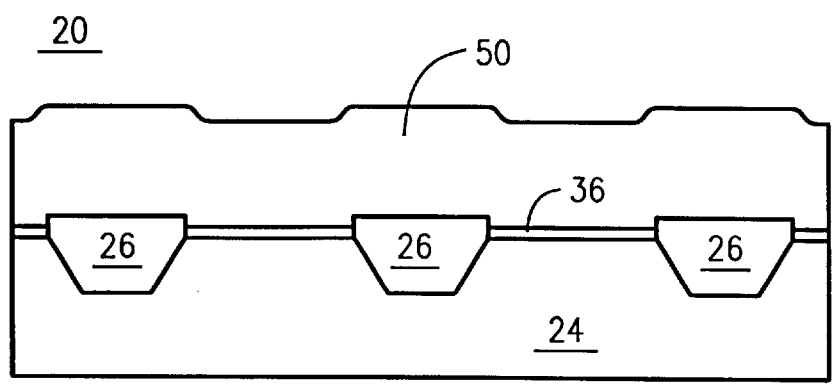
FIG. 4 shows the wafer of FIG. 3 at a processing step subsequent to that shown in FIG. 3.

FIG. 4 depicts the next step in the process, which is the deposition of a thick polysilicon layer 50 over the surface of the array 20. The layer 50 has a thickness within the range of 2000 to 3000 Angstroms, preferably 2250 to 2750 Angstroms, and most preferably is approximately 2500 Angstroms. The layer 50 is formed by CVD, plasma deposition, or other suitable means.

Figure 5:
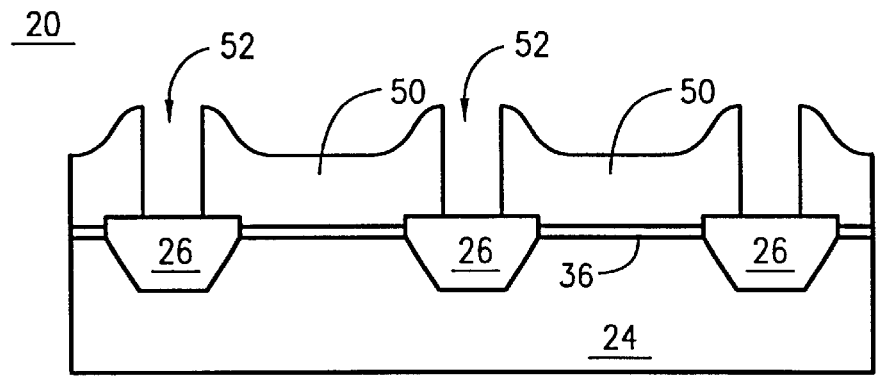
FIG. 5 shows the wafer of FIG. 3 at a processing step subsequent to that shown in FIG. 4.

Trenches 52 are then formed in the polysilicon layer 50, as shown in FIG. 5. A resist and mask (not shown) are applied, and suitable removal techniques are used to form trenches 52 approximately 0.15 to 0.25 microns wide over the isolation bars 26, in a direction orthogonal to the direction of the source and drain lines. Suitable removal techniques include wet etching using an acid such as nitric and/or hydrofluoric acid, or dry etching methods such as plasma etching or reactive ion etching (RIE).

Figure 6:
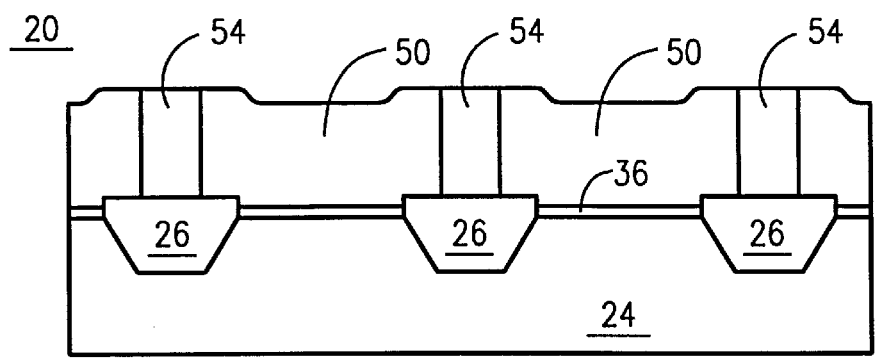
FIG. 6 shows the wafer of FIG. 3 at a processing step subsequent to that shown in FIG. 5.

Referring now to FIG. 6, nitride spacers 54 are formed in the trenches 52 by deposition of silicon nitride ($Si_3N_4$) over the surface of the array 20. The nitride may be deposited by CVD, plasma deposition, or other suitable means to a thickness of approximately 3500 to 5000 Angstroms. Following deposition, excess nitride is then removed via an etchback procedure, such as wet etching with hot phosphoric acid, or dry etching, or via planarization of the array 20 using chemical-mechanical polishing (CMP) or the like. The resultant structure is shown in FIG. 6.

Figure 7:
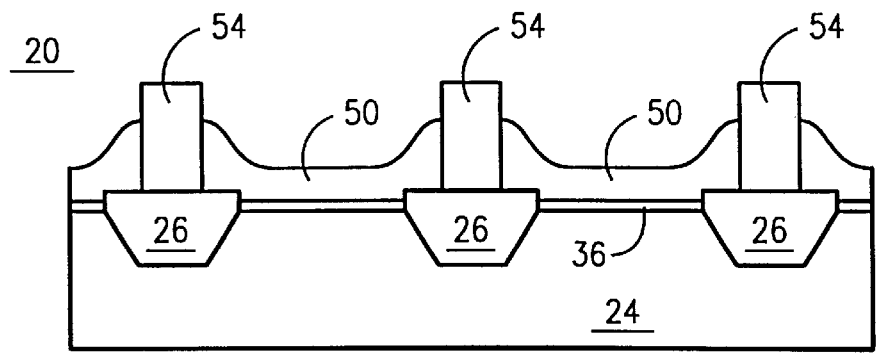
FIG. 7 shows the wafer of FIG. 3 at a processing step subsequent to that shown in FIG. 6.

FIG. 7 illustrates the etchback of the polysilicon layer 50 to form a thinner polysilicon layer 50. The etchback is performed by suitable etching techniques such as wet etching with nitric and/or hydrofluoric acid, plasma etching, or RIE. The resultant polysilicon layer 50 has a thickness of approximately 200 to 1000 Angstroms, preferably about 500 Angstroms.

Figure 8:
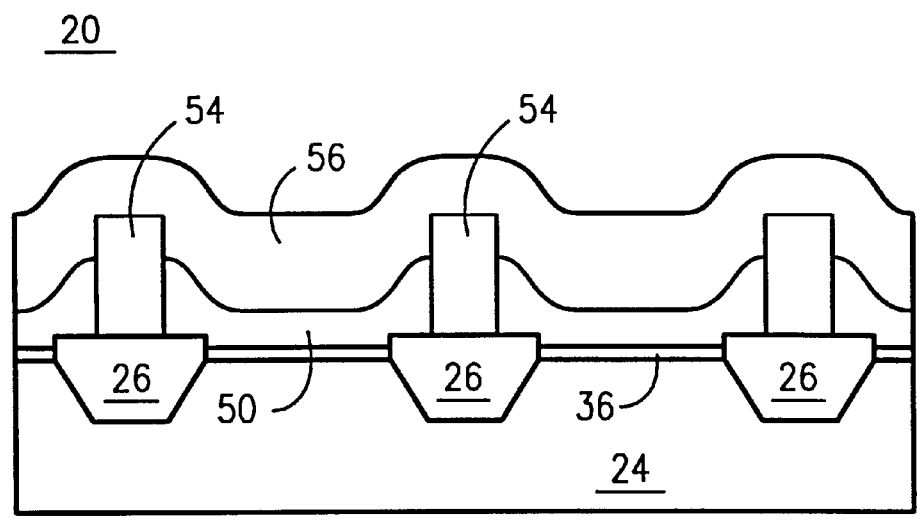
FIG. 8 shows the wafer of FIG. 3 at a processing step subsequent to that shown in FIG. 7.

As shown in FIG. 8, the next step is the formation of a polysilicon spacer layer 56 on top of the polysilicon layer 50. The polysilicon spacer layer 56 has a thickness within the range of 300 to 1000 Angstroms, preferably about 500 Angstroms. The layer 56 is formed by CVD, plasma deposition, or other suitable means.

Figure 9:
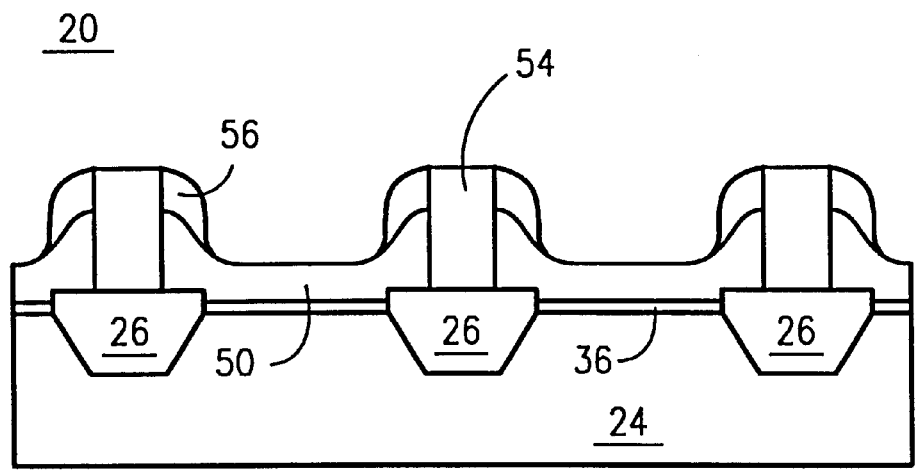
FIG. 9 shows the wafer of FIG. 3 at a processing step subsequent to that shown in FIG. 8.
Figure 10:
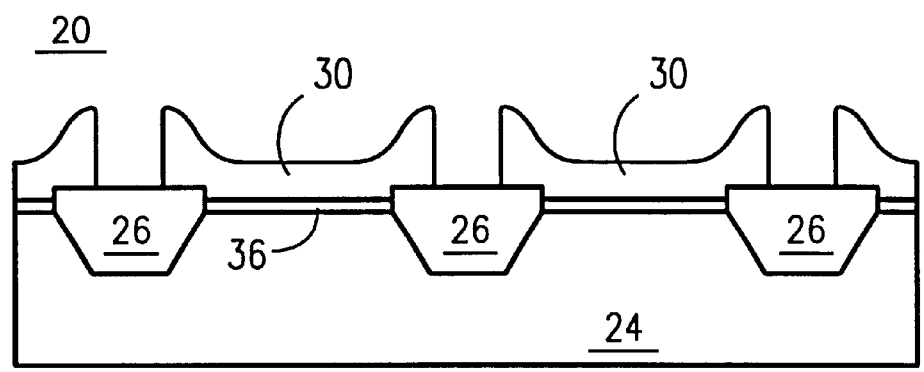
FIG. 10 shows the wafer of FIG. 3 at a processing step subsequent to that shown in FIG. 9.

The polysilicon spacer layer is then etched back by plasma etching or the like to leave small portions of the polysilicon spacer layer 56 on the polysilicon layer 50, as shown in FIG. 9. FIG. 10 illustrates the next step of the process, in which the nitride spacers 54 are removed. Removal may be accomplished by wet etching using hot phosphoric acid or another suitable etchant, or by dry etching. The polysilicon layer 50 and the wedge-shaped portions of the polysilicon spacer layer 56 that remained after etchback in FIG. 9 are shown as individual floating gates 30 in FIG. 10.

Figure 11:
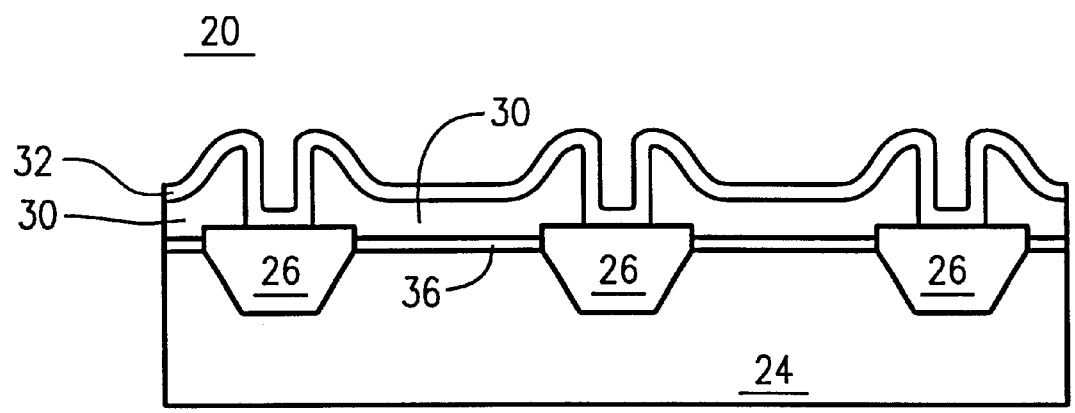
FIG. 11 shows the wafer of FIG. 3 at a processing step subsequent to that shown in FIG. 10.

As shown in FIG. 11, the next step is the formation of a dielectric layer 32 on top of the floating gates 30. The dielectric layer 32 may be formed by means known in the art, e.g., if the layer is an ONO layer, the nitride layer may be formed by CVD, and the oxide layers may be formed by CVD or by thermal oxidation. The dielectric layer 32 has a thickness within the range of approximately 70 to 180 Angstroms, preferably 120 to 140 Angstroms, and most preferably 130 Angstroms.

Figure 12:
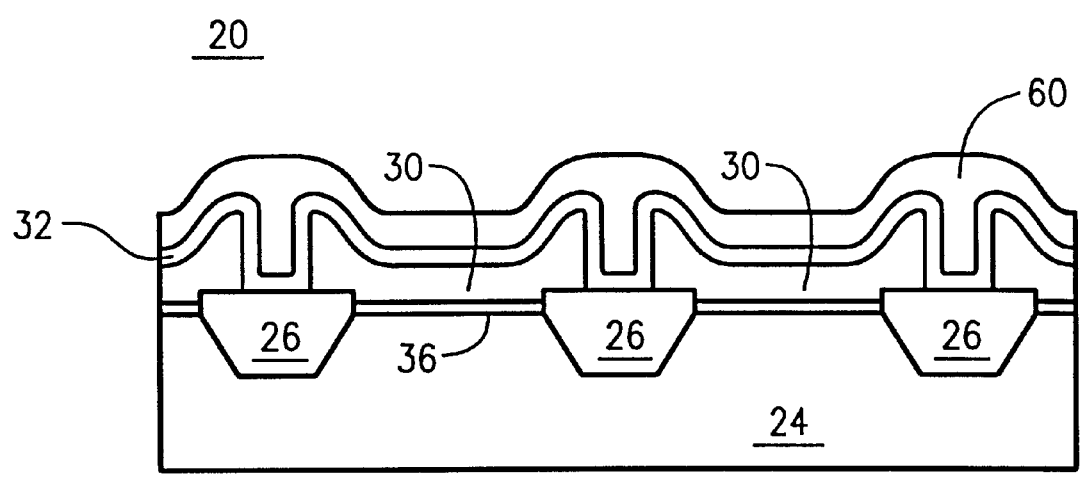
FIG. 12 shows the wafer of FIG. 3 at a processing step subsequent to that shown in FIG. 11.

The next step in the process is the deposition of a thick polysilicon layer 60 over the array 20, as shown in FIG. 12. The layer 60 has a thickness within the range of 2000 to 3000 Angstroms, preferably 2250 to 2750 Angstroms, and most preferably is approximately 2500 Angstroms. The layer 60 is formed by CVD, plasma deposition, or other suitable means. Plasma etching is now performed to etch back the polysilicon layer 60 to form control gates 34 having a thickness of approximately 300 to 1000 Angstroms, preferably about 500 Angstroms.

The split-gate transistor 22 is essentially complete at this stage, and conventional processing methods may then be used to form contacts and wiring to connect gate lines and other connections in the array 20. For example, the entire surface of the array 20 may be covered with a passivation layer of, e.g., silicon dioxide, BSG, PSG, or BPSG, which is CMP planarized and etched to provide contact holes, which may then be metallized to provide contacts to the transistor gates.

As can be seen by the embodiments described herein, the present invention encompasses split-gate transistors having U-shaped floating gates, thereby significantly increasing the surface area of the floating gates. As may be readily appreciated by persons skilled in the art, this increased surface area provides an increase in the effective capacitance between the control gate and the floating gate for each transistor. As a result, the voltage coupling ratio is improved, and the operation speed of the device is significantly enhanced.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A device array comprising:

a plurality of split-gate transistors, each of said split-gate transistors having a floating gate, a dielectric layer, and a control gate in a stacked and generally U-shaped configuration, wherein a direction from a first generally vertical portion of a given U-shaped configuration to a second generally vertical portion of said given U-shaped configuration is generally parallel to a direction of a word line of said device array.

2. The device array of claim 1 further comprising:

a plurality of isolation bars separating each of said plurality of split-gate transistors.

3. The device array of claim 1, wherein a direction from a first generally vertical portion of a given U-shaped configuration to a second generally vertical portion of said given U-shaped configuration is generally perpendicular to a direction of a bit line of said device array.

4. The device array of claim 1, wherein a generally horizontal portion of each of said U-shaped configurations is directly adjacent to a source/drain region of said device array.

5. The device array of claim 1, wherein a generally vertical portion of each of said U-shaped configurations is adjacent to an isolation bar of said device array.

6. A device array, comprising:

a plurality of split-gate transistors, each of said split-gate transistors having a floating gate, a dielectric layer and a control gate in a stacked and generally U-shaped configuration, wherein a direction from a first generally vertical portion of a given U-shaped configuration to a second generally vertical portion of said given U-shaped configuration is generally parallel to a direction of a word line of said device array and generally perpendicular to a direction of a bit line of said device array;

a generally horizontal portion of said given U-shaped configuration is directly adjacent to a first source/drain region of a split-gate transistor associated with said given U-shaped configuration;

said first source/drain region is separated from an adjacent second source/drain region in a direction parallel with said word line direction by an isolation bar, and wherein said first source/drain region is separated from an adjacent third source/drain region in a direction parallel with said bit line direction by said given U-shaped configuration.

7. A split-gate transistor comprising:

a floating gate;

a dielectric layer on top of said floating gate; and a control gate on top of said dielectric layer, wherein each of said floating gate, dielectric layer, and control gate have a generally U-shaped configuration.

8. A split-gate transistor comprising:

a floating gate;

a dielectric layer on top of said floating gate; and a control gate on top of said dielectric layer, wherein each of said floating gate, dielectric layer, and control gate have a generally U-shaped configuration, and wherein at least a first substantially vertical portion of said generally U-shaped floating gate runs in a direction substantially perpendicular to a second substantially horizontal portion of said generally U-shaped floating gate.

* * * * *